United States Patent
Chen

(10) Patent No.: US 6,277,752 B1
(45) Date of Patent: Aug. 21, 2001

(54) MULTIPLE ETCH METHOD FOR FORMING RESIDUE FREE PATTERNED HARD MASK LAYER

(75) Inventor: Chao-Cheng Chen, Tainan County (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/342,040

(22) Filed: Jun. 28, 1999

(51) Int. Cl.[7] ........................ H01L 21/302; H01L 21/3065
(52) U.S. Cl. ..................... 438/692; 438/700; 438/706; 438/710; 438/719; 438/724
(58) Field of Search .................................. 438/700, 629, 438/675, 706, 710, 692

(56) References Cited

U.S. PATENT DOCUMENTS

| | | | |
|---|---|---|---|
| 5,413,966 | * 5/1995 | Schoenborn | 438/421 |
| 5,431,772 | 7/1995 | Babie et al. | 156/643.1 |
| 5,468,342 | * 11/1995 | Nulty et al. | 438/695 |
| 5,562,801 | * 10/1996 | Nulty et al. | 216/438 |
| 5,644,153 | 7/1997 | Keller | 257/324 |
| 5,658,472 | * 8/1997 | Bartha et al. | 438/714 |
| 5,726,090 | 3/1998 | Jang et al. | 438/435 |
| 5,753,561 | * 5/1998 | Lee et al. | 438/424 |
| 5,786,276 | 7/1998 | Brooks et al. | 438/724 |
| 5,807,761 | * 9/1998 | Coronel et al. | 438/14 |
| 6,060,399 | * 5/2000 | Kim et al. | 438/706 |

\* cited by examiner

*Primary Examiner*—Benjamin L. Utech
*Assistant Examiner*—Lynette T. Umez-Eronini
(74) *Attorney, Agent, or Firm*—George O. Saile; Stephen B. Ackerman; Stephen G. Stanton

(57) ABSTRACT

A method for forming a patterned hard mask layer. There is first provided a substrate. There is then formed over the substrate a blanket hard mask layer formed of a hard mask material susceptible to etching within a first plasma etch method, where the first plasma etch method employs a first etchant gas composition which upon plasma activation forms an active fluorine containing etchant species. There is then formed over the blanket hard mask layer a patterned photoresist layer. There is then etched, while employing the first plasma etch method in conjunction with the patterned photoresist layer as a first etch mask layer, the blanket hard mask layer to form a patterned hard mask layer which defines a first aperture. The first plasma etch method also forms at the bottom of the first aperture defined by the patterned hard mask layer a residue. Finally, there is then etched, while employing a second etch method, the residue from the bottom of the first aperture. The patterned hard mask layer may then be employed for forming within a microelectronic layer, such as a semiconductor substrate, formed beneath the microelectronic layer, an aperture, such as an isolation trench, while employing a third plasma etch method. There may then be formed within the aperture a planarized aperture fill layer, such as a planarized trench isolation region, with enhanced planarity.

17 Claims, 2 Drawing Sheets

MULTIPLE ETCH METHOD FOR FORMING RESIDUE FREE PATTERNED HARD MASK LAYER

BACKGROUND OF THE INVENTION

1. Field of the Invention

The present invention relates generally to methods for forming aperture fill layers within apertures within substrates employed within microelectronic fabrications. More particularly, the present invention relates to methods for forming planarized aperture fill layers within apertures within substrates employed within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become common in the art of microelectronic fabrication, and in particular within the art of semiconductor integrated circuit microelectronic fabrication, to employ trench isolation methods, such as but not limited to shallow trench isolation (STI) methods and recessed oxide isolation (ROI) methods, to form within isolation trenches within semiconductor substrates employed within semiconductor integrated circuit microelectronic fabrications trench isolation regions which are nominally co-planar with adjoining active regions of the semiconductor substrate within which are formed the trench isolation regions. Trench isolation regions which are nominally co-planar with adjoining active regions of a semiconductor substrate are desirable within the art of semiconductor integrated circuit microelectronic fabrication, since such trench isolation regions when nominally co-planar with adjoining active regions of a semiconductor substrate most favorably accommodate an attenuated depth of focus of a photoexposure apparatus typically employed in defining patterned microelectronic layers upon the semiconductor substrate having the nominally co-planar trench isolation regions and active regions formed therein.

While trench isolation methods are thus desirable in the art of microelectronic fabrication, and particularly in the art of semiconductor integrated circuit microelectronic fabrication, for forming trench isolation regions nominally co-planar with adjoining active regions of a semiconductor substrate separated by the trench isolation regions, trench isolation regions formed employing trench isolation methods are nonetheless not formed entirely without problems within the art of microelectronic fabrication, and in particular in the art of semiconductor integrated circuit microelectronic fabrication. In particular, it is observed when forming trench isolation regions nominally co-planar with adjoining active regions of a semiconductor substrate that the trench isolation regions are often difficult to form with enhanced linewidth control and enhanced surface planarity, particularly when forming the trench isolation regions while employing a chemical mechanical polish (CMP) planarizing method.

It is thus towards the goal of forming within silicon semiconductor substrates employed within semiconductor integrated circuit microelectronic fabrications trench isolation regions with enhanced linewidth control and enhanced planarity that the present invention is most specifically directed. In a more general sense, the present invention is also directed towards the goal of forming within microelectronic fabrications which need not necessarily be semiconductor integrated circuit microelectronic fabrications planarized aperture fill layers within apertures within microelectronic layers, where the planarized aperture fill layers are formed with enhanced linewidth control and with enhanced planarity.

Various methods have been disclosed in the art of microelectronic fabrication for fabricating silicon containing layers within microelectronic fabrications.

For example, Babie et al., in U.S. Pat. No. 5,431,772, discloses a plasma etch method for forming from a silicon nitride layer in turn formed upon a silicon oxide layer within a microelectronic fabrication, where the silicon nitride layer has formed upon its surface opposite the silicon oxide layer a silicon oxide containing surface layer, a patterned silicon nitride layer with a plasma etch selectivity of the patterned silicon nitride layer with respect to the silicon oxide layer. The plasma etch method employs: (1) a first plasma employing a first etchant gas composition comprising a fluorine containing etchant gas and an optional hydrogen bromide etchant gas, in absence of an oxidant etchant gas, for etching through the silicon oxide containing surface layer formed upon the silicon nitride layer, followed by; (2) a second plasma employing a second etchant gas composition comprising a hydrogen bromide etchant gas, an optional fluorine containing etchant gas and an oxidant etchant gas, for etching a bulk of the silicon nitride layer to form the patterned silicon nitride layer with the plasma etch selectivity of the patterned silicon nitride layer with respect to the silicon oxide layer.

In addition, Keller, in U.S. Pat. No. 5,644,153, also discloses a plasma etch method for forming from a silicon nitride layer formed upon a silicon oxide layer within a microelectronic fabrication a patterned silicon nitride layer, where the patterned silicon nitride layer is formed with uniform critical dimension control and with a plasma etch selectivity of the patterned silicon nitride layer with respect to the silicon oxide layer. To realize the foregoing objects, the plasma etch method comprises a two step plasma etch method which employs: (1) a first plasma employing a first etchant gas composition comprising a fluorocarbon etchant gas to form from the silicon nitride layer a partially etched silicon nitride layer having a sidewall polymer residue formed thereupon, followed by; (2) a second plasma employing a second etchant gas composition comprising a hydrogen bromide etchant gas and a nitrogen trifluoride etchant gas employed under conditions of high plasma pressure and low plasma power to form from the partially etched silicon nitride layer the patterned silicon nitride layer with the uniform linewidth control of the patterned silicon nitride layer and the plasma etch selectivity of the patterned silicon nitride layer with respect to the silicon oxide layer.

Further, Jang et al., in U.S. Pat. No. 5,726,090, discloses a method for forming, with enhanced gap filling properties and enhanced step coverage properties, within an isolation trench employed within a silicon semiconductor substrate employed within a semiconductor integrated circuit microelectronic fabrication, a silicon oxide trench isolation region formed employing an ozone assisted sub-atmospheric pressure thermal chemical vapor deposition (SACVD) method. The method employs forming within the isolation trench: (1) a first silicon oxide trench liner layer formed employing a thermal oxidation method, the first silicon oxide trench liner layer having formed thereupon; (2) a second silicon oxide trench liner layer formed employing a plasma enhanced chemical vapor deposition method employing silane as a silicon source material, where the second silicon oxide trench liner layer is nitrogen plasma treated prior to forming thereupon the silicon oxide trench isolation region formed employing the ozone assisted sub-atmospheric pressure thermal chemical vapor deposition (SACVD) method.

Finally, Brooks et al., in U.S. Pat. No. 5,786,276, discloses yet another plasma etch method for forming within a microelectronic fabrication from a silicon nitride layer formed upon a silicon oxide layer a patterned silicon nitride layer with a plasma etch selectivity of the patterned silicon nitride layer with respect to the silicon oxide layer. The plasma etch method employs a downstream plasma employing a single etchant gas composition comprising: (1) a fluoromethane etchant gas or a difluoromethane etchant gas; (2) a carbon tetrafluoride etchant gas and; (3) an oxygen etchant gas, at a composite molar ratio of the fluoromethane etchant gas or the difluoromethane etchant gas, with respect to the carbon tetrafluoride etchant gas, further with respect to oxygen etchant gas, the composite molar ratio selected such that the desired plasma etch selectivity of the patterned silicon nitride layer with respect to the silicon oxide layer is realized.

Desirable in the art of semiconductor integrated circuit microelectronic fabrication are additional methods and materials which may be employed for forming within isolation trenches within silicon semiconductor substrates employed within semiconductor integrated circuit microelectronic fabrications trench isolation regions with enhanced linewidth control and enhanced planarity. More generally desirable in the art of microelectronic fabrication are additional methods and materials which may be employed for forming within apertures within microelectronic layers employed within microelectronic fabrications planarized aperture fill layers with enhanced linewidth control and enhanced planarity.

It is towards the foregoing objects that the present invention is both specifically and more generally directed.

SUMMARY OF THE INVENTION

A first object of the present invention is to provide a method for forming within an aperture within a microelectronic layer employed within a microelectronic fabrication a planarized aperture fill layer with enhanced linewidth control.

A second object of the present invention is to provide a method in accord with the first object of the present invention where the planarized aperture fill layer is formed with enhanced planarity.

A third object of the present invention is to provide a method in accord with the first object of the present invention and the second object of the present invention, wherein the microelectronic layer is a semiconductor substrate, the aperture is an isolation trench formed within the semiconductor substrate and the aperture fill layer is a trench isolation region formed within the isolation trench.

A fourth object of the present invention is to provide a method in accord with the first object of the present invention, the second object of the present invention or the third object of the present invention, which method is readily commercially implemented.

In accord with the objects of the present invention, there is provided by the present invention a method for forming a patterned hard mask layer. To practice the method of the present invention, there is first provided a substrate. There is then formed over the substrate a blanket hard mask layer formed of a hard mask material susceptible to etching within a first plasma etch method, where the first plasma etch method employs a first etchant gas composition which upon plasma activation forms an active fluorine containing etchant species. There is then formed over the blanket hard mask layer a patterned photoresist layer. There is then etched, while employing the first plasma etch method in conjunction with the patterned photoresist layer as a first etch mask layer, the blanket hard mask layer to form a patterned hard mask layer which defines a first aperture. The first plasma etch method also forms at the bottom of the first aperture defined by the patterned hard mask layer a residue. Finally, there is then etched, while employing a second etch method, the residue from the bottom of the first aperture.

At least the patterned hard mask layer may then be employed as a second etch mask layer in conjunction with a third plasma etch method for forming a second aperture, such as an isolation trench, within a microelectronic layer, such as a semiconductor substrate, formed beneath the patterned hard mask layer. Similarly, there may then be formed within the second aperture a planarized aperture fill layer, such as a planarized trench isolation region within the isolation trench, with enhanced linewidth control and enhanced planarity.

The present invention provides a method for forming within an aperture within a microelectronic layer employed within a microelectronic fabrication a planarized aperture fill layer with enhanced linewidth control and enhanced planarity. The present invention realizes the enhanced linewidth control of the planarized aperture fill layer by employing when forming a second aperture within a microelectronic layer within which is formed the planarized aperture fill layer a patterned hard mask layer. The present invention realizes the enhanced planarity of the planarized aperture fill layer by etching, while employing a second etch method, a residue from the bottom of a first aperture defined by the patterned hard mask layer prior to etching the second aperture within the microelectronic layer while employing a third plasma etch method.

The present invention may be employed where the microelectronic layer is a semiconductor substrate, the aperture is an isolation trench formed within the semiconductor substrate and the aperture fill layer is a trench isolation region formed within the isolation trench. The present invention does not discriminate with respect to the nature of the microelectronic layer, the aperture and the aperture fill layer, provided that there is employed when forming the aperture within the microelectronic layer a patterned hard mask layer formed of a hard mask material susceptible to etching within a first plasma which employs a first etchant gas composition which upon plasma activation forms an active fluorine containing etchant species, and wherein incident to forming from a blanket hard mask layer the patterned hard mask layer there is formed at a bottom of an aperture defined by the patterned hard mask layer a residue.

The method of the present invention is readily commercially implemented. The present invention employs methods and materials as are otherwise generally known in the art of microelectronic fabrication. Since it is a process control and materials selection which provides at least in part the present invention, rather than the existence of methods and materials which provides the present invention, the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
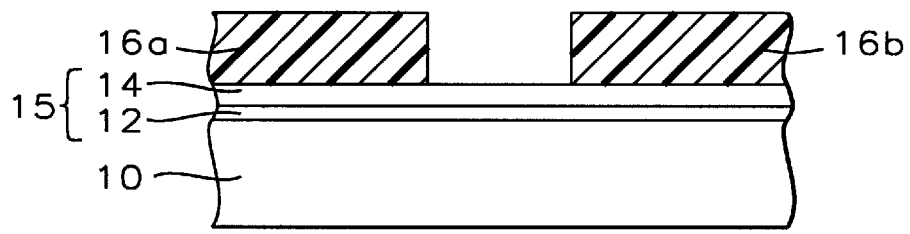
FIG. 1, FIG. 2, FIG. 3, FIG. 4, FIG. 5 and FIG. 6 show a series of schematic cross-sectional diagrams illustrating the results of forming, in accord with a preferred embodiment of the present invention, a planarized trench isolation region within an isolation trench within a semiconductor substrate within a semiconductor integrated circuit microelectronic fabrication.

The present invention provides a method for forming within an aperture within a microelectronic layer employed within a microelectronic fabrication a planarized aperture fill layer with enhanced linewidth control and enhanced planarity. The present invention realizes the enhanced linewidth control of the planarized aperture fill layer by employing when forming a second aperture within a microelectronic layer within which is formed the planarized aperture fill layer a patterned hard mask layer. The present invention realizes the enhanced planarity of the planarized aperture fill layer by etching, while employing a second etch method, a residue from the bottom of a first aperture defined by the patterned hard mask layer prior to etching the second aperture within the microelectronic layer while employing a third plasma etch method.

Although the preferred embodiment of the present invention illustrates the present invention within the context of forming within a semiconductor substrate employed within a semiconductor integrated circuit microelectronic fabrication a planarized trench isolation region within an isolation trench with enhanced linewidth control and with enhanced planarity, the present invention may also be employed for forming with enhanced linewidth control and enhanced planarity planarized aperture fill layers within apertures within microelectronic layers employed within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications, given the provisos that: (1) the aperture within the microelectronic layer is formed employing a patterned hard mask layer in turn formed from a blanket hard mask layer formed from a hard mask material susceptible to etching within a first plasma employing a first etchant gas composition which upon plasma activation forms an active fluorine containing etchant species; and (2) there is formed at the bottom of an aperture defined by the patterned hard mask layer a residue incident to forming the patterned hard mask layer from the blanket hard mask layer while employing the first plasma etch method. Thus, the microelectronic layer within which may be formed an aperture within which may be formed a planarized aperture fill layer in accord with the present invention may be formed from a microelectronic material selected from the group including but not limited to microelectronic conductor materials, microelectronic semiconductor materials and microelectronic dielectric materials. Similarly, the planarized aperture fill layer may be formed employing aperture fill materials independently selected from the group including but not limited to aperture fill conductor materials, aperture fill semiconductor materials and aperture fill dielectric materials.

Referring now to FIG. 1 to FIG. 6, there is shown a series of schematic cross-sectional diagrams illustrating the results of forming, in accord with a preferred embodiment of the present invention, a planarized trench isolation region within an isolation trench within a semiconductor substrate employed within a semiconductor integrated circuit microelectronic fabrication in accord with a preferred embodiment of the present invention. Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10 having formed thereupon a blanket pad oxide layer 12, in turn having formed thereupon a blanket silicon nitride layer 14 in turn having formed thereupon a pair of patterned photoresist layers 16a and 16b. As is illustrated within the schematic cross-sectional diagram of FIG. 1, the blanket pad oxide layer 12 and the blanket silicon nitride layer 14 in the aggregate form a blanket hard mask layer 15. Within the preferred embodiment of the present invention, each of the foregoing semiconductor substrate 10, blanket pad oxide layer 12, blanket silicon nitride layer 14 and pair of patterned photoresist layers 16a and 16b may be formed employing methods and materials as are conventional in the art of semiconductor integrated circuit microelectronic fabrication.

For example, although it is known in the art of semiconductor integrated circuit microelectronic fabrication that semiconductor substrates are available with either dopant polarity, several dopant concentrations and various crystallographic orientations, for the preferred embodiment of the present invention, the semiconductor substrate 10 is typically and preferably a (100) silicon semiconductor substrate having an N- or P-doping.

Similarly, although it is also known in the art of semiconductor integrated circuit microelectronic fabrication that blanket pad oxide layers may be formed employing methods including but not limited to blanket pad oxide layer thermal growth methods and blanket pad oxide layer deposition methods, for the preferred embodiment of the present invention, the blanket pad oxide layer 12 is typically and preferably formed employing a blanket pad oxide layer thermal growth method at a temperature of from about 700 to about 1000 degrees centigrade to form the blanket pad oxide layer 12 of silicon oxide of thickness about 90 to about 120 angstroms formed upon the semiconductor substrate 10.

Similarly, although it is also known in the art of semiconductor integrated circuit microelectronic fabrication that blanket silicon nitride layers may be formed employing methods including but not limited to chemical vapor deposition (CVD) methods, plasma enhanced chemical vapor deposition (PECVD) methods and physical vapor deposition (PVD) sputtering methods, for the preferred embodiment of the present invention the blanket silicon nitride layer 14 is typically and preferably formed employing a chemical vapor deposition (CVD) method employing silane as a silicon source material and ammonia as a nitrogen source material, to form the blanket silicon nitride layer 14 of thickness from about 1000 to about 1600 angstroms formed upon the blanket pad oxide layer 12.

Finally, within the preferred embodiment of the present invention with respect to the pair of patterned photoresist layers 16a and 16b, the pair of patterned photoresist layers 16a and 16b may be formed employing photoresist materials as are conventional in the art of microelectronic fabrication, including photoresist materials selected from the general groups of photoresist materials including but not limited to positive photoresist materials and negative photoresist materials. Typically and preferably each of the patterned photoresist layers 16a and 16b is formed to a thickness of from about 5000 to about 10000 angstroms.

Figure 2:
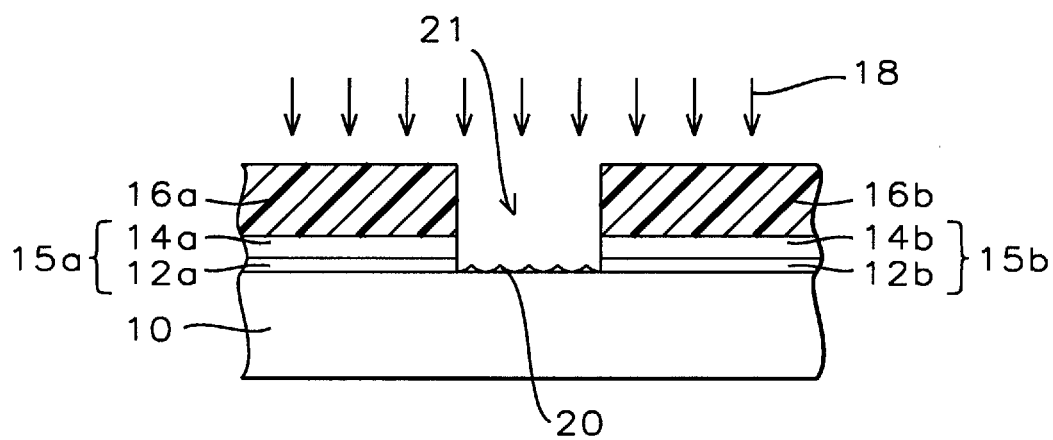

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket silicon nitride layer 14 and the blanket pad oxide layer 12 have been sequentially patterned, while employing the pair of patterned photoresist layers 16a and 16b as a first etch mask layer, through etching with a first plasma 18, to form a corresponding pair of patterned silicon nitride layers 14a and 14b formed and aligned upon a corresponding pair of patterned pad oxide layers 12a and 12b. As is illustrated within the schematic cross-sectional diagram of FIG. 2, the patterned silicon nitride layer 14a and the corresponding patterned pad oxide layer 12a, as well as the patterned silicon nitride layer 14b and the corresponding patterned pad oxide layer 12b, form a pair of patterned hard mask layers 15a and 15b. Incident to forming the pair of patterned silicon nitride layers 14a and 14b and the pair of patterned pad oxide layers 12a and 12b through etching the corresponding blanket silicon nitride layer 14 and the corresponding blanket pad oxide layer 12 within the first plasma 18, there is formed a first aperture 21 defined at least in part by the pair of patterned silicon nitride layers 14a and 14b and the pair of patterned pad oxide layers 12a and 12b, at the bottom of which first aperture 21 is formed a first plasma etch residue layer 20 upon an exposed surface of the semiconductor substrate 10.

As is illustrated within the schematic cross-sectional diagram of FIG. 2, within the preferred embodiment of the present invention it is typical and preferred that the blanket silicon nitride layer 14 and the blanket pad oxide layer 12 are both completely etched through to expose the surface of the semiconductor substrate 10 without need for selective etching of the blanket silicon nitride layer 14 with respect to the blanket pad oxide layer 12, although an etch selectivity of either the blanket silicon nitride layer 14 or the blanket pad oxide layer 12 with respect to the semiconductor substrate 10 of at least about 2 to about 5 is preferred.

Within the preferred embodiment of the present invention, the first plasma 18 employs a first etchant gas composition which upon plasma activation forms an active fluorine containing etchant species. More preferably, the first etchant gas composition comprises at least one of a perfluorocarbon etchant gas of up to about four carbon atoms and a hydrofluorocarbon etchant gas of up to about four carbon atoms, along with a suitable optional sputter gas component and optional diluent gas components to provide a stable first plasma 18. Yet more preferably, the first plasma 18 employs a first etchant gas composition comprising carbon tetrafluoride, trifluoromethane and argon.

When etching the blanket silicon nitride layer 14 and the blanket pad oxide layer 12 to form the corresponding pair of patterned silicon nitride layers 14a and 14b and the corresponding pair of patterned pad oxide layers 12a and 12b which in an aggregate form a corresponding pair of patterned hard mask layers 15a and 15b upon an eight inch diameter semiconductor substrate 10, the first plasma 18 is also formed employing: (1) a reactor chamber pressure of from about 30 to about 100 mtorr; (2) a radio frequency power of from about 400 to about 1000 watts at a source radio frequency of 13.56 MHZ; (3) a magnetic field bias of up to about 50 gauss; (4) a semiconductor substrate 10 temperature of from about zero to about 50 degrees centigrade; (5) a carbon tetrafluoride flow rate of from about 10 to about 50 standard cubic centimeters per minute (sccm); (6) a trifluoromethane flow rate of from about 10 to about 50 standard cubic centimeters per minute (sccm); (7) an argon flow rate of from about 50 to about 200 standard cubic centimeters per minute (sccm); and (8) an optional oxygen flow rate of up to about 10 standard cubic centimeters per minute (sccm).

Within the preferred embodiment of the present invention with respect to the first plasma etch residue layer 20, the first plasma etch residue layer 20 is believed to be a fluoropolymer passivating residue layer analogous to a fluoropolymer sidewall passivating residue as is disclosed in the art. See, for example, Keller, U.S. Pat. No. 5,644,153, as cited within the Description of the Related Art, as above, the teachings of all of which related art are incorporated herein by reference. Although not specifically illustrated within the schematic cross-sectional diagram of FIG. 2, it is also assumed within the present invention that a fluoropolymer sidewall passivating layer is formed upon the sidewalls of the first aperture 21, analogously with that which is disclosed within Keller.

Figure 3:
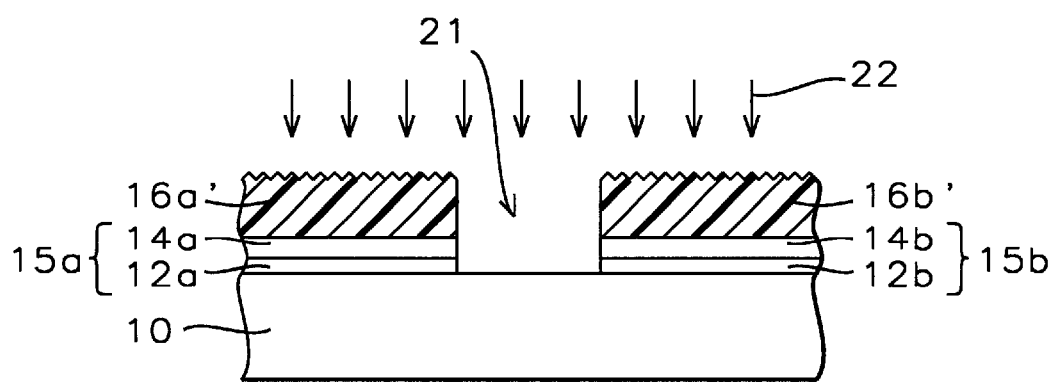

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein first plasma etch residue layer 20 has been stripped from the bottom of the first aperture 21, through etching with a second plasma 22. As is illustrated within the schematic cross-sectional diagram of FIG. 3, incident to stripping the first plasma etch residue layer 20 from the bottom of the first aperture 21 through etching with the second plasma 22, the pair of patterned photoresist layers 16a and 16b is further etched to form a pair of etched patterned photoresist layers 16a' and 16b'.

Within the preferred embodiment of the present invention with respect to the second plasma 22, the second plasma 22 preferably employs an etchant gas composition which effectively strips the first plasma etch residue layer 20 from the semiconductor substrate 10 while not necessarily substantially etching the semiconductor substrate 10. It has been found experimentally that the second plasma 22 preferably employs an etchant gas composition which upon plasma activation provides an active sputter etching component and an optional active oxidizing component. While other etchant gas compositions are not precluded in order to provide the foregoing components (i.e. alternative active sputter etching components might include, but are not limited to xenon and alternative active oxidizing components might include, but are not limited to ozone, nitrous oxide and nitric oxide), typically and preferably within the preferred embodiment of the present invention, the second plasma 22 preferably employs an argon sputtering component and an oxygen oxidizing component.

When stripping from the first aperture 21 the first plasma etch residue layer 20 formed upon an eight inch diameter semiconductor substrate 10, the second plasma 22 is preferably also formed employing: (1) a reactor chamber pressure of from about 50 to about 100 mtorr; (2) a radio frequency of from about 300 to about 700 watts at a source radio frequency of 13.56 MHZ; (3) a magnetic field bias of up to about 80 gauss; (4) a semiconductor substrate 10 temperature of from about zero to about 50 degrees centigrade; (5) an argon sputter component flow rate of from about 50 to about 150 standard cubic centimeters per minute (sccm); and (6) an oxygen oxidant component flow rate of from about 10 to about 50 standard cubic centimeters per minute (sccm).

As is understood by a person skilled in the art, it may also be feasible within the present invention to strip the first plasma etch residue layer 20 from within the bottom of the first aperture 21 while employing a wet chemical etch method, which may also simultaneously strip from the semiconductor integrated circuit microelectronic fabrication whose schematic cross-sectional diagram is illustrated in FIG. 2 the pair of patterned photoresist layers 16a and 16b. Although feasible and under certain circumstances desirable within the present invention, such is not typically preferred within the preferred embodiment of the present invention since by employing solely plasma etch methods within the preferred embodiment of the present invention for processing the various layers formed upon semiconductor substrate 10 it is feasible and preferred that such plasma processing may be undertaken sequentially in-situ within a single plasma reactor chamber or within adjoining plasma reactor chamber within a multi-chamber "cluster" plasma reactor tool.

Figure 4:
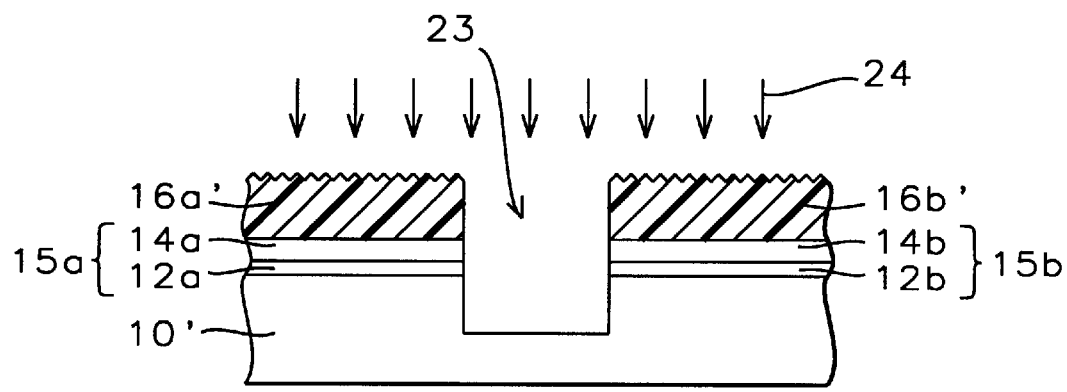

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the semiconductor substrate 10 has been etched to form an etched semiconductor substrate 10' having formed therein an isolation trench 23 (i.e. a second aperture) through etching with a third plasma 24, while employing the pair of patterned silicon nitride layers 14a and 14b and the pair of patterned pad oxide layers 12a and 12b (i.e. the pair of patterned hard mask layers 15a and 15b) as a second etch mask layer. Within the preferred embodiment of the present invention, the third plasma 24 typically and preferably employs a third etchant gas composition which upon plasma activation provides an active etchant species appropriate for etching the semiconductor substrate 10. Typically and preferably such an active etchant species will be an active halogen etchant species other than an active fluorine containing etchant species. Typically and preferably the third plasma 24 will employ a third etchant gas composition comprising at least one of chlorine, hydrogen chloride, bromine and hydrogen bromide. More typically and most preferably, the third plasma employs an etchant gas composition comprising chlorine and hydrogen bromide, along with optional sputter gas components and optional diluent gases as may be desirable to provide a stabilized third plasma 24.

When forming from an eight inch diameter semiconductor substrate 10 as illustrated within the schematic cross-sectional diagram of FIG. 3, an eight inch diameter etched semiconductor substrate 10' having formed therein the isolation trench 23 as illustrated within the schematic cross-sectional diagram of FIG. 4 while employing the third plasma 24, the third plasma 24 is typically and preferably also formed employing: (1) a reactor chamber pressure of from about 30 to about 120 mtorr; (2) a radio frequency power of from about 300 to about 1000 watts at a source radio frequency of 13.56 MHZ; (3) a magnetic field bias of up to about 50 gauss; (4) a semiconductor substrate 10 temperature of from about zero to about 50 degrees centigrade; (5) a chlorine flow rate of up to about 50 standard cubic centimeters per minute (sccm); (6) a hydrogen bromide flow rate of from about 50 to about 150 standard cubic centimeters per minute (sccm); (7) a similarly optional carbon tetrafluoride flow rate of up to about 50 standard cubic centimeters per minute (sccm); (8) a likewise optional oxygen flow rate of up to about 10 standard cubic centimeters per minute (sccm); and (9) a helium flow rate of from about 50 to about 150 standard cubic centimeters per minute (sccm).

Figure 5:
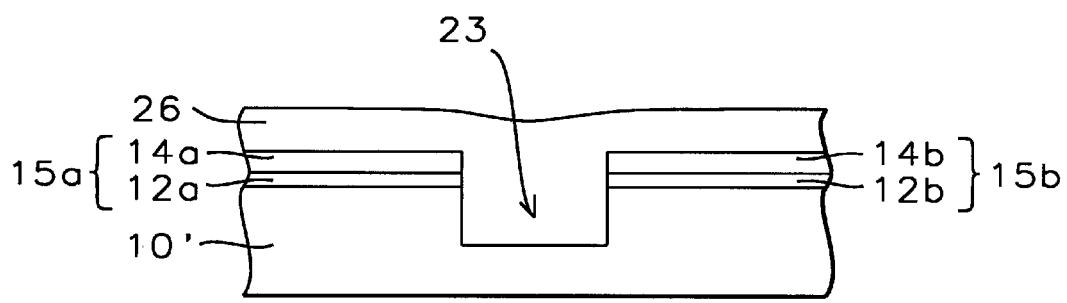

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, the pair of etched patterned photoresist layers 16a' and 16b' has been stripped from the corresponding pair of patterned silicon nitride layers 14a and 14b. Within the preferred embodiment of the present invention, the pair of etched patterned photoresist layers 16a' and 16b' may be stripped from the corresponding pair of patterned silicon nitride layers 14a and 14b while employing methods as are conventional in the art of semiconductor integrated circuit microelectronic fabrication, such methods including but not limited to wet chemical etch methods, dry plasma etch methods and composites of wet chemical etch methods and dry plasma etch methods.

There is also shown within FIG. 5 formed over the etched semiconductor substrate 10' and formed into the isolation trench 23 a blanket trench fill dielectric layer 26. Although it is known in the art of semiconductor integrated circuit microelectronic fabrication that trench fill dielectric layers may be formed employing methods including but not limited to chemical vapor deposition (CVD) methods, plasma enhanced chemical vapor deposition (PECVD) methods and physical vapor deposition (PVD) sputtering methods, for the preferred embodiment of the present invention, the blanket trench fill dielectric layer 26 is typically and preferably formed, at least in part, while employing a sub-atmospheric pressure thermal chemical vapor deposition (SACVD) method or a high density plasma chemical vapor deposition (HDP-CVD) method to form the blanket trench fill dielectric layer 26 of a silicon oxide dielectric material. Typically and preferably, the blanket trench fill dielectric layer 26 is formed to a thickness of from about 6000 to about 9000 angstroms while completely filling the isolation trench 23.

Figure 6:
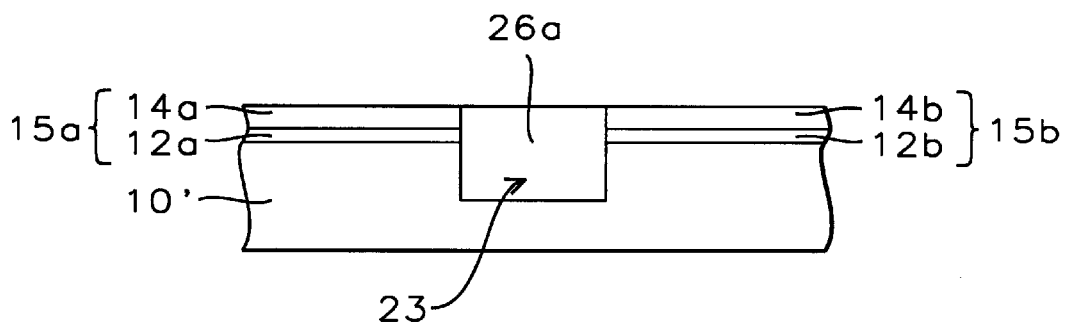

Referring now to FIG. 6, there is shown a schematic cross-sectional diagram illustrating the results of further processing of the semiconductor integrated circuit microelectronic fabrication whose schematic cross-sectional diagram is illustrated in FIG. 5. Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein the blanket trench fill dielectric layer 26 has been planarized to form a trench isolation region 26a within the isolation trench 23.

Although it is known in the art of semiconductor integrated circuit microelectronic fabrication that blanket trench fill dielectric layers may be planarized to form trench isolation regions within isolation trenches within semiconductor substrates employed within semiconductor integrated circuit microelectronic fabrications while employing methods including but not limited to reactive ion etch (RIE) etchback planarizing methods and chemical mechanical polish (CMP) planarizing methods, for the preferred embodiment of the present invention the blanket trench fill dielectric layer 26 is typically and preferably planarized to form the planarized isolation region 26a within the isolation trench 23 while employing a chemical mechanical polish (CMP) planarizing methods as is otherwise conventional in the art of semiconductor integrated circuit microelectronic fabrication.

Upon forming the microelectronic fabrication whose schematic cross-sectional diagram is illustrated within FIG. 6, there is formed a semiconductor integrated circuit microelectronic fabrication having formed therein within an isolation trench within a semiconductor substrate employed within the semiconductor integrated circuit microelectronic fabrication a trench isolation region with enhanced linewidth control and with enhanced planarity. The trench isolation region is formed with enhanced linewidth control insofar as the isolation trench within which is formed the trench isolation region is formed employing a patterned hard mask layer. The trench isolation region is formed with enhanced planarity insofar as there is employed when forming the patterned hard mask layer which defines the isolation trench a multistep plasma etch method which employs a stripping of a residue formed within the bottom of an aperture defined by the patterned hard mask layer prior to etching the semiconductor substrate to form the isolation trench therein while employing the patterned hard mask layer.

EXAMPLES

There was obtained two eight inch diameter (100) silicon semiconductor substrates and fabricated thereupon a semiconductor integrated circuit microelectric fabrication structure equivalent to the semic conductor integrated circuit microelectronic fabrication structure as illustrated within the schematic cross-sectional diagram of FIG. 1. Each of the semiconductor substrates had formed thereupon a silicon oxide blanket pad oxide layer of thickness about 100 angstroms formed employing a thermal oxidation of the silicon semiconductor substrate at a temperature of about 850 degrees centigrade for a time period of about 60 minutes. Formed upon each of the silicon oxide blanket pad oxide layers was a blanket silicon nitride layer formed to a thickness of about 1600 angstroms employing a chemical vapor deposition (CVD) method employing silane as a silicon source material and ammonia as a nitrogen source material. Finally, there was formed upon each of the blanket silicon nitride layers a patterned photoresist layer of thickness about 7600 angstroms formed employing a positive photoresist material available from Shientsu Co. The patterned photoresist layer defined a series of apertures of minimum bidirectional linewidth about 0.2 by about 0.6 microns corresponding with the locations where a series of isolation regions was desired to be formed into each of the semiconductor substrates.

A first of the two semiconductor substrates was then subjected to a three step plasma etch method in accord with the preferred embodiment of the present invention.

A first step within the three step plasma etch method employed a first plasma employing a first etchant gas composition consisting of carbon tetrafluoride, trifluoromethane and argon for etching through the blanket silicon nitride layer and the silicon oxide blanket pad oxide layer to form a corresponding patterned hard mask layer comprising a pair of patterned silicon nitride layers formed and aligned upon a pair of patterned silicon oxide pad oxide layers for further etching into the semiconductor substrate. The first plasma also employed: (1) a reactor chamber pressure of about 50 mtorr; (2) a radio frequency power of about 600 watts at a source radio frequency of 13.56 MHZ; (3) a magnetic field bias of about 30 gauss; (4) a semiconductor substrate temperature of about 15 degrees centigrade; (5) a carbon tetrafluoride flow rate of about 15 standard cubic centimeters per minute (sccm); (6) a trifluoromethane flow rate of about 10 standard cubic centimeters per minute (sccm); (7) an argon flow rate of about 100 standard cubic centimeters per minute (sccm); and (8) an oxygen flow rate of about 5 standard cubic centimeters per minute (sccm).

A second step within the three step plasma etch method employed a second plasma employing a second etchant gas composition consisting of argon and oxygen for stripping from the bottoms of a series of first apertures defined by the patterned hard mask layer which exposed a series of surfaces of the semiconductor substrate a series of first plasma etch residue layers. The second plasma also employed: (1) a reactor chamber pressure of about 50 mtorr; (2) a source radio frequency power of about 500 watts at a source radio frequency of 13.56 MHZ; (3) a magnetic field bias of about 30 gauss; (4) a semiconductor substrate temperature of about 15 degrees centigrade; (5) an argon flow rate of about 100 standard cubic centimeters per minute (sccm); and (6) an oxygen flow rate of about 5 standard cubic centimeters per minute (sccm).

A third step within the three step plasma etch method employed a third plasma employed a third etchant gas composition comprising chlorine and hydrogen bromide for etching a series of isolation trenches within the semiconductor substrate while employing the patterned hard mask layer as a second etch mask layer. The third plasma also employed: (1) a reactor chamber pressure of about 100 mtorr; (2) a radio frequency power of about 900 watts at a source radio frequency of 13.56 MHZ; (3) a magnetic field bias of about 30 gauss; (4) a semiconductor substrate temperature of about 15 degrees centigrade; (5) a chlorine flow rate of about 40 standard cubic centimeters per minute (sccm); (6) a hydrogen bromide flow rate of about 70 standard cubic centimeters per minute; (7) a carbon tetrafluoride flow rate of about 30 standard cubic centimeters per minute (sccm); (8) an oxygen flow rate of about 5 standard cubic centimeters per minute (sccm); and (9) a helium flow rate of about 20 standard cubic centimeters per minute (sccm).

The remaining patterned photoresist layer was then stripped from the first semiconductor substrate employing: (1) an oxygen plasma stripping at about 2 torr reactor chamber pressure, an oxygen flow rate of about 500 standard cubic centimeters per minute (sccm), a semiconductor substrate temperature of about 250 degrees centigrade and a stripping time period of about 30 minutes, followed by; (2)

a 10:1 dilute hydrofluoric acid etch at a temperature of about 50 degrees centigrade for a time period of about 10 minutes, followed by; (3) a Caro's acid (i.e. aqueous sulfuric acid/hydrogen peroxide) stripper at a temperature of about 50 degrees centigrade for a time period of about 30 minutes, followed by; (4) an aqueous ammonium hydroxide/hydrogen peroxide clean at a temperature of about 50 degrees centigrade for a time period of about 60 minutes, followed by; (5) a deionized water rinsing and drying.

The semiconductor substrate was then inspected for surface defects while employing a light scattering surface defect inspection method employing an inspection tool available from KLA Corporation, in conjunction with a method as is otherwise conventional in the art of semiconductor integrated circuit microelectronic fabrication.

The second of the two semiconductor substrates was treated identically with the first of the two semiconductor substrates, but with the absence of etching within the second plasma which was intended to strip the series of first plasma etch residue layers from within the bottoms of first apertures within the composite patterned silicon nitride/patterned silicon oxide pad oxide patterned hard mask layer prior to etching the exposed portions of the semiconductor substrate to form the isolation trenches therein.

The measured number of defects within the semiconductor substrates as determined employing the light scattering inspection method for each of the semiconductor substrates is reported in Table I.

TABLE I

| S/S Processing | Defects per wafer |
|---|---|
| with second plasma | 250+/−50 |
| w/o second plasma | 50+/−10 |

As is seen from review of the data within Table I, there is observed when employing a second plasma within a three step plasma etch method in accord with the preferred embodiment of the present invention a significant reduction in defect density within a semiconductor substrate within which is formed isolation trenches, such that there is additionally realized a reduction of surface replicated defects, such as asperities and scratches, when forming planarized trench isolation regions within the isolation trenches.

While not wishing to be bound to any particular theory as to why the three step plasma etch method in accord with the preferred embodiment of the present invention provides an enhanced surface planarity of planarized trench isolation regions within isolation trenches formed employing the three step plasma etch method in accord with the preferred embodiment of the present invention, it is believed that the first plasma etch residue layer which is removed employing the second plasma would if not removed by the second plasma become hardened within the third plasma and provide a micromask which would provide inhomogeneous etching of a semiconductor substrate with attendant asperity formation within an isolation trench within the semiconductor substrate. Such asperities within the isolation trench are then replicated within a blanket trench fill dielectric layer upon forming the blanket trench fill dielectric layer within the isolation trench, and such replicated asperities within the blanket trench fill dielectric layer then presumably provide for deteriorated planarity as evidenced by scratches and asperities when forming a planarized trench isolation region from the blanket trench fill dielectric layer having the asperities formed therein.

As is understood by a person skilled in the art, the preferred embodiment and examples of the present invention are illustrative of the present invention rather than limiting of the present invention, revisions and modifications may be made to methods, materials, structures and dimensions through which is provided the preferred embodiment and examples of the present invention while still providing embodiments and examples which are within the spirit and scope of the present invention, as defined by the accompanying claims.

What is claimed is:

1. A method for forming an isolation region within an isolation trench comprising:

providing a semiconductor substrate;

forming upon the semiconductor substrate a blanket silicon nitride hard mask layer susceptible to etching within a first plasma etch method, where the first plasma etch method employs a first etchant gas composition which upon plasma activation forms an active fluorine containing etchant species;

forming over the silicon nitride hard mask layer a patterned photoresist layer; the patterned photoresist layer leaving exposed a portion of the silicon nitride hard mask layer;

etching, while employing the first plasma etch method in conjunction with the patterned photoresist layer as a first etch mask layer, the exposed portion of the blanket silicon nitride hard mask layer to form a patterned silicon nitride hard mask layer which defines an aperture at the bottom of which is exposed a portion of the semiconductor substrate, the first plasma etch method also forming within the bottom of the aperture defined by the patterned silicon nitride hard mask layer a residue upon the exposed portion of the semiconductor substrate;

etching, while employing a second etch method, the residue from the bottom of the aperture;

etching, while employing a third plasma etch method in conjunction with at least the patterned silicon nitride hard mask layer as a second etch mask layer, the exposed portion of the semiconductor substrate to form an isolation trench within the semiconductor substrate; and forming within the isolation trench a planarized trench isolation region.

2. The method of claim 1 wherein by etching the residue from the bottom of the aperture while employing the second etch method the planarized trench isolation region is formed with enhanced planarity.

3. The method of claim 1 wherein the second etch method is selected from the group consisting of wet chemical etch methods and dry plasma etch methods.

4. The method of claim 1 wherein the planarized trench isolation region is formed employing a chemical mechanical polish (CMP) planarizing method.

5. The method of claim 1 wherein:

the second etch method is a second plasma etch method; and the first plasma etch method, the second plasma etch method and the third plasma etch method are undertaken sequentially insitu.

6. A method for forming an isolation region within an isolation trench comprising:

providing a semiconductor substrate;

forming upon the semiconductor substrate a blanket silicon nitride hard mask layer susceptible to etching within a first plasma etch method, where the first plasma etch method employs a first etchant gas composition which upon plasma activation forms an active fluorine containing etchant species;

forming over the silicon nitride hard mask layer a patterned photoresist layer; the patterned photoresist layer leaving exposed a portion of the silicon nitride hard mask layer;

etching, while employing the first plasma etch method in conjunction with the patterned photoresist layer as a first etch mask layer, the exposed portion of the blanket silicon nitride hard mask layer to form a patterned silicon nitride hard mask layer which defines an aperture at the bottom of which is exposed a portion of the semiconductor substrate, the first plasma etch method also forming within the bottom of the aperture defined by the patterned silicon nitride hard mask layer a residue upon the exposed portion of the semiconductor substrate;

etching, while employing a second etch method, the residue from the bottom of the aperture;

etching, while employing a third plasma etch method in conjunction with at least the patterned silicon nitride hard mask layer as a second etch mask layer, the exposed portion of the semiconductor substrate to form an isolation trench within the semiconductor substrate; and forming within the isolation trench a planarized trench isolation region; wherein by etching the residue form the bottom of the aperture while employing the second etch method the planarized trench isolation region is formed with enhanced planarity.

7. The method of claim 6, wherein the second etch method is selected from the group consisting of wet chemical etch methods and dry plasma etch methods.

8. The method of claim 6, wherein:
the second etch method is a second plasma etch method; and the first plasma etch method, the second plasma etch method and the third plasma etch method are undertaken sequentially insitu.

9. A method for forming an isolation region within an isolation trench comprising:

providing a semiconductor substrate;

forming upon the semiconductor substrate a blanket silicon nitride hard mask layer susceptible to etching within a first plasma etch method, where the first plasma etch method employs a first etchant gas composition which upon plasma activation forms an active fluorine containing etchant species;

forming over the blanket silicon nitride hard mask layer a patterned photoresist layer; the patterned photoresist layer leaving exposed a portion of the silicon nitride hard mask layer;

etching, while employing the first plasma etch method in conjunction with the patterned photoresist layer as a first etch mask layer, the exposed portion of the blanket silicon nitride hard mask layer to form a patterned silicon nitride hard mask layer which defines an aperture at the bottom of which is exposed a portion of the semiconductor substrate, the first plasma etch method also forming within the bottom of the aperture defined by the patterned silicon nitride hard mask layer a residue upon the exposed portion of the semiconductor substrate;

etching, while employing a second etch method, the residue from the bottom of the aperture; the second etch method being selected from the group consisting of wet chemical etch methods and dry plasma etch methods;

etching, while employing a third plasma etch method in conjunction with at least the patterned silicon nitride hard mask layer as a second etch mask layer, the exposed portion of the semiconductor substrate to form an isolation trench within the semiconductor substrate; and forming within the isolation trench a planarized trench isolation region.

10. The method of claim 9, wherein by etching the residue form the bottom of the aperture while employing the second etch method the planarized trench isolation region is formed with enhanced planarity.

11. The method of claim 9, wherein the planarized trench isolation region is formed employing a chemical mechanical polish (CMP) planarizing method.

12. The method of claim 9, wherein:
the second etch method is a second plasma etch method; and the first plasma etch method, the second plasma etch method and the third plasma etch method are undertaken sequentially insitu.

13. A method for forming an isolation region within an isolation trench comprising:

providing a semiconductor substrate;

forming a silicon nitride layer over the semiconductor substrate;

forming a patterned photoresist layer over the silicon nitride layer; the patterned photoresist layer leaving a portion of the silicon nitride layer exposed without any overlying photoresist layer;

etching the exposed portion of the silicon nitride layer with a first plasma etch method in conjunction with the patterned photoresist layer as a first etch mask layer to form a patterned silicon nitride hard mask layer which defines an aperture exposing a portion of the semiconductor substrate having a residue thereupon; the first plasma etch method employing a first etchant gas composition which upon plasma activation forms an active fluorine containing etchant species and employing:

a reactor chamber pressure of from about 30 to 100 mTorr;

a radio frequency power of from about 400 to 1000 watts at a source radio frequency of 13.56 MHz;

a magnetic field bias of up to about 500 gauss;

a semiconductor substrate of from about 0 to 50° C.;

a carbon tetrafluoride flow rate of from about 10 to 50 sccm;

a trifluoromethane flow rate of from about 10 to 50 sccm;

an argon flow rate of from about 50 to 200 sccm; and an oxygen flow rate of 0 to about 10 sccm;

etching the residue from the bottom of the aperture using a second etch method to expose the portion of the semiconductor substrate; the second etch method employing:

a reactor chamber pressure of from about 50 to 100 mTorr;

a radio frequency power of from about 300 to 700 watts at a source radio frequency of 13.56 MHz;

a magnetic field bias of up to about 80 gauss;

a semiconductor substrate of from about 0 to 50° C.;

an argon sputter component flow rate of from about 50 to 150 sccm; and an oxygen oxidant flow rate of from about 10 to 50 sccm;

etching the exposed portion of the semiconductor substrate with a third plasma etch method in conjunction with at least the patterned silicon nitride hard mask layer as a second etch mask layer to form an isolation trench within the semiconductor substrate; and forming a planarized trench isolation region within the isolation trench.

14. The method of claim 13, wherein by etching the residue form the bottom of the aperture while employing the second etch method the planarized trench isolation region is formed with enhanced planarity.

15. The method of claim 13, wherein the second etch method is selected from the group consisting of wet chemical etch methods and dry plasma etch methods.

16. The method of claim 13, wherein the planarized trench isolation region is formed employing a chemical mechanical polish (CMP) planarizing method.

17. The method of claim 13, wherein:

the second etch method is a second plasma etch method; and the first plasma etch method, the second plasma etch method and the third plasma etch method are undertaken sequentially insitu.

* * * * *